(12) United States Patent
Nagrodsky

(10) Patent No.: US 11,527,843 B2
(45) Date of Patent: Dec. 13, 2022

(54) CONNECTOR WITH INSULATING ASSEMBLY FOR PROVIDING MUTUAL INSULATION AMONG CONNECTING PINS

(71) Applicant: ALSTOM Transport Technologies, Saint-Ouen-sur-Seine (FR)

(72) Inventor: Nicholas Nagrodsky, Melbourne, FL (US)

(73) Assignee: ALSTOM TRANSPORT TECHNOLOGIES, Saint-Ouen-sur-Seine (FR)

( * ) Notice: Subject to any disclaimer, the term of this patent is extended or adjusted under 35 U.S.C. 154(b) by 97 days.

(21) Appl. No.: 17/065,626

(22) Filed: Oct. 8, 2020

(65) Prior Publication Data
US 2022/0115801 A1   Apr. 14, 2022

(51) Int. Cl.
*H01R 13/15*   (2006.01)
*H05K 1/11*    (2006.01)
*H01R 12/51*   (2011.01)
*H01R 12/52*   (2011.01)

(52) U.S. Cl.
CPC ............. *H01R 13/15* (2013.01); *H01R 12/51* (2013.01); *H01R 12/523* (2013.01); *H05K 1/11* (2013.01)

(58) Field of Classification Search
None
See application file for complete search history.

(56) References Cited

U.S. PATENT DOCUMENTS 7,686,649 B2 *   3/2010   Pepe ................... H01R 13/719
                                                439/620.21

* cited by examiner

*Primary Examiner* — Ross N Gushi
(74) *Attorney, Agent, or Firm* — Nixon & Vanderhye

(57) ABSTRACT

Disclosed is a connector including at least: a printed circuit board including preferentially a plurality of stacked layers; a plurality of connecting pins which are spaced apart from each other and transversally pass through the printed circuit board from a bottom external surface up to an opposite top external surface of the printed circuit board; and an insulating assembly for providing insulation among the plurality of connecting pins, wherein the insulating assembly includes at least one insulator which is configured to be coupled to the printed circuit board and is configured to insulate at least a portion of each connection pin from a corresponding portion of one or more adjacent connecting pins of the plurality of connecting pins.

18 Claims, 2 Drawing Sheets

CONNECTOR WITH INSULATING ASSEMBLY FOR PROVIDING MUTUAL INSULATION AMONG CONNECTING PINS

TECHNICAL FIELD

The present disclosure concerns in general the field of connectors. More in particular, the present disclosure relates to a connector comprising an insulation assembly for mutually insulating its connection pins, and to a device comprising such a connector.

BACKGROUND OF THE DISCLOSURE

As known, connectors are devices used in several fields for realizing input/output connections within the system where they are installed.

To this end, several connecting pins are used and they need to be properly spaced from each other by a minimum distance in order to guarantee a proper mutual insulation.

These spaces may reach significant values. For example, in the rail industry, discrete I/O that are considered "vital" or "failsafe" must be spaced from each other on a printed circuit board (PCB) by a minimum distance which may vary according to the local standards. For instance, in USA this distance is about 0.250 inches or 0.64 cm for an outer layer of a PCB, and 0.1 inches or 0.26 cm for inner layers of the PCB. In Europe, this distance is smaller depending on the voltage applied, the pollution degree, et cetera, but it is still a significant distance.

Clearly, the need of having such mutual distances results in using large connectors and/or in selectively populating/depopulating pins in a connector to achieve the required minimum spacing.

BRIEF DESCRIPTION OF THE INVENTION

Hence, it is evident that there is room and desire for improvements in the way connectors are nowadays realized, in particular as regard to the insulating distance provided among the connection pins used.

The present disclosure is aimed at providing a solution to this end and, in one aspect, it provides a connector comprising at least:

a printed circuit board including preferentially a plurality of stacked layers;

a plurality of connecting pins which are spaced apart from each other and transversally pass through the printed circuit board from a bottom external surface up to an opposite top external surface of the printed circuit board;

an insulating assembly for providing insulation among the plurality of connecting pins, wherein the insulating assembly comprises at least one insulator which is configured to be coupled to the printed circuit board and is configured to insulate at least a portion of each connection pin from a corresponding portion of one or more adjacent connecting pins of the plurality of connecting pins.

In another aspect, the present disclosure provides a device which is configured to perform one or more vital functions, comprising a device which is configured to perform one or more vital functions, comprising at least one connector, the at least one connector comprising at least:

a printed circuit board including preferentially a plurality of stacked layers;

a plurality of connecting pins which are spaced apart from each other, and transversally pass through the printed circuit board from a bottom external surface up to an opposite top surface of the printed circuit board;

an insulating assembly for providing insulation among the plurality of connecting pins, wherein the insulating assembly comprises at least one insulator which is configured to be coupled to the printed circuit board and is configured to insulate at least a portion of each connection pin from a corresponding portion of one or more adjacent connecting pins of the plurality of connecting pins.

BRIEF DESCRIPTION OF THE DRAWINGS

Detailed characteristics and advantages will become apparent from the description of some preferred but not exclusive exemplary embodiments of a connector according to the present disclosure, illustrated only by way of non-limitative examples with the accompanying drawings, wherein.

DETAILED DESCRIPTION OF THE DISCLOSURE

Figure 1:
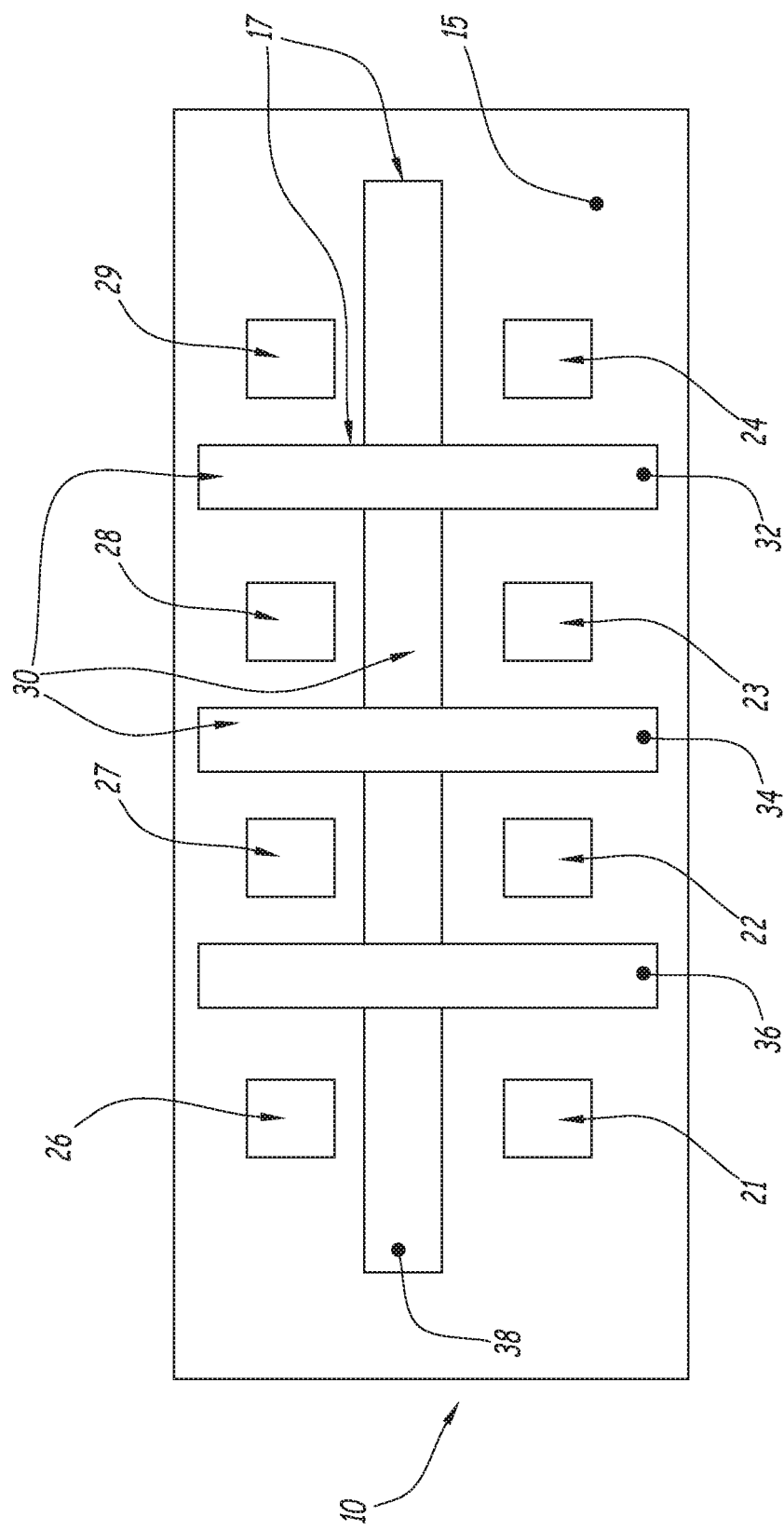
FIG. 1 is top plan view schematically illustrating a portion of a connector according to an exemplary embodiment of the present disclosure.

It should be noted that in the detailed description that follows, identical or similar components, either from a structural and/or functional point of view, may have the same reference numerals, regardless of whether they are shown in different embodiments of the present disclosure. It should be also noted that in order to clearly and concisely describe the present disclosure, the drawings may not necessarily be to scale and certain features of the disclosure may be shown in somewhat schematic form.

Further, when the term "adapted" or "arranged" or "configured" or "shaped", is used herein while referring to any component as a whole, or to any part of a component, or to a combination of components, it has to be understood that it means and encompasses correspondingly either the structure, and/or configuration and/or form and/or positioning.

In addition, when the term "substantial" or "substantially" is used herein, it has to be understood as encompassing an actual variation of plus or minus 5% with respect to an indicated reference value, time or position, and when the terms transversal or transversally are hereby used, they have to be understood as encompassing a direction non-parallel to the reference part(s) or direction(s)/axis they refer to, and perpendicularity has to be considered a specific case of transverse direction.

Finally, in the following description and claims, the numeral cardinals first, second, third et cetera . . . , will be used only for the sake of clarity of description and in no way they should be understood as limiting for whatsoever reason; in particular, the indication of a component referred to for instance as the "third . . . " does not imply necessarily the presence or strict need of the preceding "first" or "second" ones, unless such presence is clearly evident for the correct functioning of the subject connector, nor that the order should be the one described in the illustrated exemplary embodiment(s).

Figure 2:
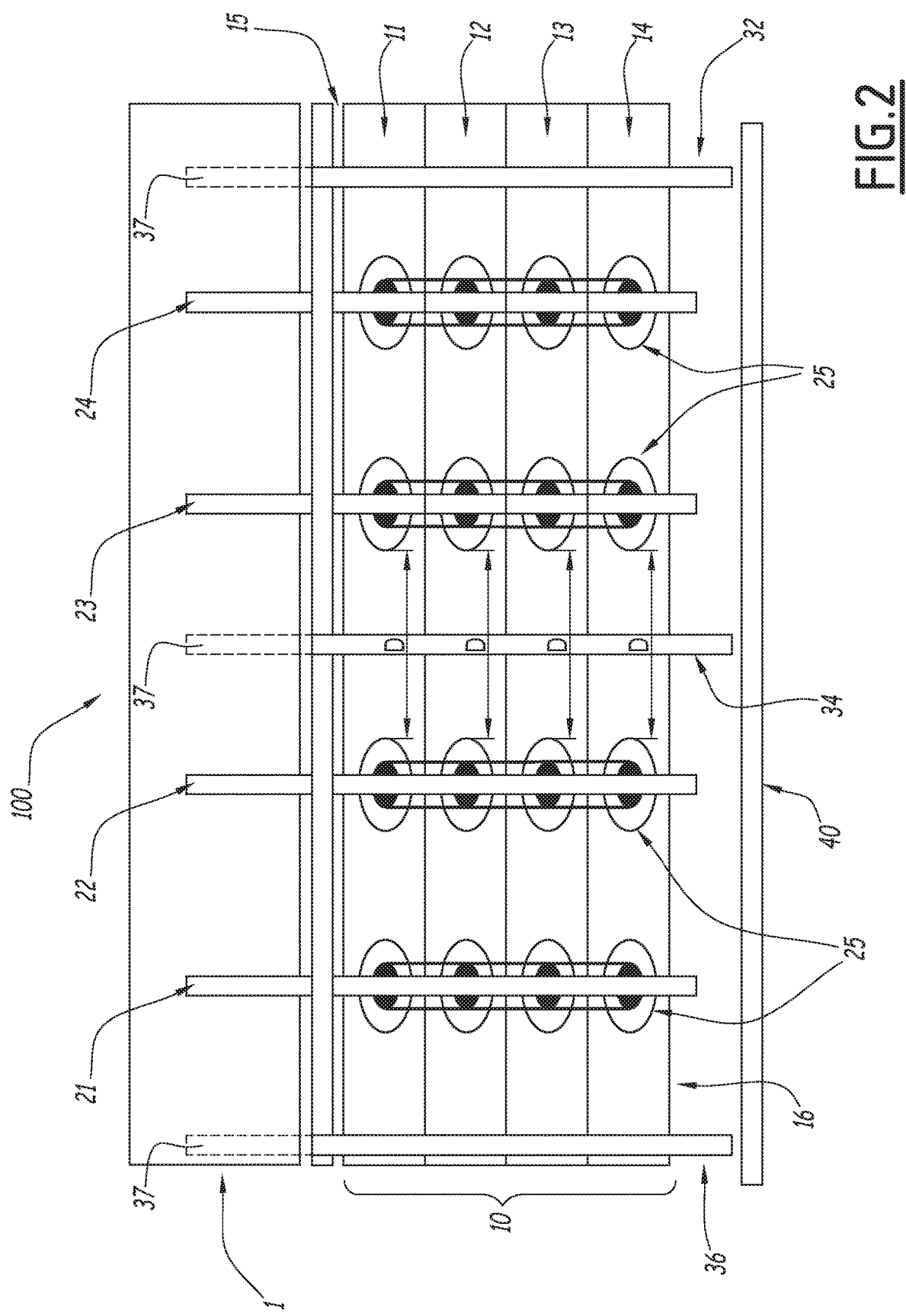
FIG. 2 is a side schematically illustrating a portion of a connector according to another exemplary embodiment of the present disclosure.

FIG. 2 illustrates an exemplary embodiment of a connector according to the present disclosure, therein indicated by the overall reference number 100.

As illustrated in FIG. 2, the exemplary connector 100 comprises a printed circuit board 10, hereinafter also referred to as the PCB, which includes preferably a plurality of stacked layers. In the exemplary embodiment illustrated, there are represented four layers, and in particular a top outer layer 11, two intermediate or inner layers 12 and 13, and a bottom outer layer 14.

Clearly, the PCB 10 can comprise any suitable number of stacked up layers; further, the use herein of terms like top or bottom should be meant as referring to the views illustrated in the attached figures and just for the sake of ease of illustration and in no way they have any limiting meaning; indeed, as those skilled in the art would easily appreciate, the connector 100 can be used in practical applications installed in different configurations, and hence, a top or bottom part can assume a different position relative to a reference view.

The connector 100 further comprises a plurality of connecting pins which are spaced apart from each other and transversally pass through the printed circuit board. For instance, according to the exemplary embodiment illustrated, the connecting pins transversally pass through the plurality of stacked layers 11, 12, 13, 14, via a series of aligned through holes 25, from a bottom external surface 16 up to an opposite top external surface 15 of the printed circuit board 10.

In the example illustrated, and as visible in FIG. 1, there are represented eight connecting pins, substantially parallel to each other, which are equally distributed along two parallel rows, namely four connecting pins 21, 22, 23 and 24 are positioned in sequence along the first row, and the other four connecting pins 26, 27, 28 and 29 are positioned in sequence along the second row. Clearly, the number of pins can be any according to the applications and the pins can be positioned in any number or rows, or in any other suitable configuration.

Usefully, the connector 100 further comprises an insulating assembly, e.g. a solid insulating assembly, for providing insulation among the plurality of connecting pins 21, 22, 23, 24, 25, 26, 27, 28 and 29. The insulating assembly comprises at least one insulator, in particular a solid insulator, indicated in FIG. 1 by the reference number 30, which is configured to be coupled to the printed circuit board 10 at the top external surface 15 thereof, and is configured to insulate at least a portion of each connection pin from a corresponding portion of one or more, preferably all, adjacent connecting pins around it.

According to a possible embodiment, the at least one insulator 30 is made of any suitable insulating material such as plastics material or rubber.

According to a possible embodiment, the printed circuit board comprises a through notch 17 and the at least one solid insulator 30 comprises at least one portion adapted to be inserted inside the through notch 17.

In particular, according to the exemplary embodiment illustrated in FIG. 1, the at least one insulator 30 comprises a grid-shaped portion which is inserted in and passes through said through notch 17. Clearly, such portion and/or the whole at least one insulator 30 can assume any other suitable shape.

According to an embodiment, the grid-shaped portion is fixedly connected inside the through notch 17, for example by gluing or by any other suitable fastening means.

In one possible embodiment, the grid-shaped portion comprises one or more first insulating barriers which are spaced apart from and substantially parallel to each other, and one or more second insulating barriers which are spaced apart from and substantially parallel to each other, wherein the one or more first insulating barriers being substantially perpendicular to the one or more second insulating barriers.

In the exemplary embodiment illustrated in FIG. 1, the grid-shaped portion of the insulator 30 comprises three first barriers 32, 34, 36, each running between two adjacent connecting pins disposed along the same first row and the respective same second row, and only one second barrier 38 running between the two rows of connecting pins.

In turn, the through notch 17 has a corresponding configuration with a plurality of slits aimed at receiving the various first and second barriers. In this way, the combination of the two sets of barriers creates spaces surrounded by insulating walls, and inside each space there is allocated a portion of a single connecting pin which is therefore better insulated from the corresponding portion of all adjacent connecting pins.

Clearly the number of first and second barriers (and correspondingly of the slits of the notch 17) can be varied according to the numbers of connecting pins along a row and of the number of rows along which the connecting pins are positioned.

Further, in the example illustrated in FIG. 2, there are two connecting pins positioned between two adjacent first barriers, for example the first and second connecting pins 21 and 22 are positioned between the two first barriers 36 and 34, and the two connecting pins 23 and 24 are positioned between the two first barriers 34 and 32. However, it has to be understood, that a first barrier can be preferably positioned between each couple of adjacent connecting pins as shown in FIG. 1.

According to one possible embodiment, the insulating assembly further comprises an insulating cover, for example a solid insulating cover, which is indicated in FIG. 2 by the reference number 1 (and is not illustrated in FIG. 1 for the sake of ease of illustration);

Conveniently, the insulating cover 1 is configured to be placed over the top external surface 15 of the printed circuit board and to provide insulation for at least the tip end portion of each connecting pin 21, 22, 23, 24, 26, 27, 28 and 29; it has to be noted that the insulating cover 1 and the top external surface 15 can be the same piece or simply part of the connector itself.

In particular, in the exemplary embodiment illustrated in FIG. 2, each of the plurality of connecting pins has a first end tip portion protruding outwardly from the top external surface 15 of the printed circuit board 10, and a second end portion protruding outwardly from the opposite bottom of the top external surface 16 of the printed circuit board 10. In this case, the solid insulating cover 1 is arranged to have portions adapted to surround each a respective first end tip portion, or alternatively holes for accommodating inside each a respective first end tip portion. If instead the first end tip portion of each connecting pin does not protrude outwardly from the top external surface 15, then the presence of the surrounding portions or of the holes is not necessary and the insulating cover 1 can have a lower flat surface which is devised to rest against the top surface and to close the openings of the holes 25 provided on the outer layer 11.

In one possible embodiment, on the top side, for instance either any part of the connector itself or the insulating grid-shaped portion can extend from the internal layers of the PCB 10 up past the top side layer of the PCB 10 into the cover 1 to ensure that there is no creepage path along the top surface of the PCB 10, as for example schematically represented in FIG. 2 by the dotted portions indicated by the reference number 37.

According to one embodiment, the insulating cover 1 is made of any suitable insulating material such as plastics material or rubber.

Conveniently, according to one embodiment, the insulating cover 1 and the grid-shaped portion 30 are realized in a monolithic or single piece, i.e. integrally to each other. According to this embodiment, the first barriers 32, 34, 36 are inserted from the top surface 15 inside the through notch 17 and protrude outwardly from the bottom surface 16, up to when the insulating cover 1 arrives to rest against the top surface 15. The insulating cover 1 is then properly secured to the PCB 10 in any suitable manner, and in this case it is not necessary to fixedly connect, e.g. gluing the grid-shaped portion inside the through notch 17.

Alternatively, the solid insulating cover 1 can be realized as separate pieces. In this case, the solid insulating cover 1 is connected to the top surface 15 of the PCB 10, and the grid shaped portion is fixedly connected inside the notch 17 as previously described.

In one possible embodiment, the insulating assembly further comprises an insulating cap, schematically represented in FIG. 2 by the reference number 40.

The insulating cap 40 is configured to be connected to or house inside an end portion of the one or more first and second insulating barriers 32, 34, 36 and 38 protruding outwardly from the bottom external surface 16 of the printed circuit board 10. The insulating cap, which can have the shape of a casing, is also made of any suitable insulating material such as plastics material or rubber.

In this way, an overall closed insulating environment can be formed around the plurality of connecting pins. If necessary, the cap 40 can be provided with further insulating barriers or fins which can be used for providing insulation among end portions of adjacent pins which can be longer than and thus may extend further away down from the first and second insulating barriers.

Hence, it is evident that the connector 100 according to the present disclosure, compared with prior art solutions, has a more compact structure or can have a higher density of populated pins since the solid insulating assembly used allows to substantially reduce the mutual distance between adjacent connecting pins, which can be for example of 0.01 inches (0.03 cm), as represented in FIG. 2. This is particular advantageous in case of vital devices or vital pieces of equipment, namely devices which are devised to perform determined tasks in a fail-safe manner within a system where they are installed, and to revert to a safe status if there occurs any failure or malfunctioning. Indeed, in this case is very important to properly distance the various Is/Os associated to the connecting pins.

Therefore, the present disclosure encompasses also any suitable device devised to perform one or more vital functions and comprising at least one connector 100 of the type previously described, and in particular as defined in the relevant claim(s). In particular, such a device is a vital railway device adapted to be used in a railway network; examples of such vital or fail-safe devices are level crossings, lights, and for instance, in case or a fault involving a light, an assumed red signal is a type of safe status.

The connector 100 and related vital device thus conceived are susceptible of modifications and variations, all of which are within the scope of the inventive concept as defined in particular by the appended claims; all the details may furthermore be replaced with technically equivalent elements.

The invention claimed is:

1. A connector, comprising:
   a printed circuit board including a plurality of stacked layers;
   a plurality of connecting pins which are spaced apart from each other and transversally pass through the printed circuit board from a bottom external surface of the printed circuit board up to an opposite top external surface of the printed circuit board; and
   an insulating assembly for providing insulation among the plurality of connecting pins,
   wherein the insulating assembly comprises at least one insulator which is configured to be coupled to the printed circuit board and is configured to insulate at least a portion of each connection pin from a corresponding portion of one or more adjacent connecting pins of the plurality of connecting pins on both sides of the printed circuit board at said bottom external surface and at said opposite top surface.

2. The connector according to claim 1, wherein the printed circuit board comprises a through notch and the at least one insulator comprises at least one portion inserted inside the through notch.

3. The connector according to claim 2, wherein the at least one insulator comprises a grid-shaped portion which is inserted in and passes through said through notch.

4. The connector according to claim 3, wherein the grid-shaped portion is fixedly connected inside the through notch.

5. The connector assembly according to claim 3, wherein said grid shaped portion comprises one or more first insulating barriers which are spaced apart from and substantially parallel to each other, and one or more second insulating barriers which are spaced apart from and substantially parallel to each other, the one or more first insulating barriers being substantially perpendicular to the one or more second insulating barriers.

6. The connector assembly according to claim 5, wherein the insulating assembly further comprises an insulating cap which is configured to be connected to or to house inside an end portion of the one or more first and second insulating barriers protruding outwardly from the bottom external surface of the printed circuit board.

7. The connector assembly according to claim 6, wherein said insulating cap is made of plastics or rubber.

8. The connector according to claim 2, wherein the at least one insulator comprises a grid-shaped portion which is inserted in and passes through said through notch, wherein the insulating assembly further comprises an insulating cover which is configured to be placed over the top external surface of the printed circuit board and to cover a tip end portion of each connecting pin, and wherein the insulating cover and the grid-shaped portion are realized in a monolithic piece.

9. The connector according to claim 1, wherein the insulating assembly further comprises an insulating cover which is configured to be placed over the top external surface of the printed circuit board and to cover a tip end portion of each connecting pin.

10. The connector assembly according to claim 9, wherein said insulating cover is made of plastics or rubber.

11. The connector assembly according to claim 1, wherein said at least one insulator is made of plastics or rubber.

12. A device which is configured to perform one or more fail-safe functions, comprising:
    at least one connector, the at least one connector comprising at least:

a printed circuit board including a plurality of stacked layers;

a plurality of connecting pins which are spaced apart from each other, and transversally pass through the printed circuit board from a bottom external surface of the printed circuit board up to an opposite top surface of the printed circuit board;

an insulating assembly for providing insulation among the plurality of connecting pins, wherein the insulating assembly comprises at least one insulator which is configured to be coupled to the printed circuit board and is configured to insulate at least a portion of each connection pin from a corresponding portion of one or more adjacent connecting pins of the plurality of connecting pins on both sides of the printed circuit board at said bottom external surface and at said opposite top surface.

13. The device according to claim 12, wherein said device is a fail-safe device adapted to be used in a railway network.

14. A connector, comprising:

a printed circuit board including a plurality of stacked layers;

a plurality of connecting pins which are spaced apart from each other and transversally pass through the printed circuit board from a bottom external surface of the printed circuit board up to an opposite top external surface of the printed circuit board; and an insulating assembly for providing insulation among the plurality of connecting pins, wherein the insulating assembly comprises at least one insulator which is configured to be coupled to the printed circuit board and is configured to insulate at least a portion of each connection pin from a corresponding portion of one or more adjacent connecting pins of the plurality of connecting pins, wherein the printed circuit board comprises a through notch and the at least one insulator comprises at least one portion inserted inside the through notch, and wherein the at least one insulator comprises a grid-shaped portion which is inserted in and passes through said through notch.

15. The connector according to claim 14, wherein the grid-shaped portion is fixedly connected inside the through notch.

16. The connector assembly according to claim 14, wherein said grid shaped portion comprises one or more first insulating barriers which are spaced apart from and substantially parallel to each other, and one or more second insulating barriers which are spaced apart from and substantially parallel to each other, the one or more first insulating barriers being substantially perpendicular to the one or more second insulating barriers.

17. The connector assembly according to claim 16, wherein the insulating assembly further comprises an insulating cap which is configured to be connected to or to house inside an end portion of the one or more first and second insulating barriers protruding outwardly from the bottom external surface of the printed circuit board.

18. The connector assembly according to claim 17, wherein said insulating cap is made of plastics or rubber.

* * * * *